US009054338B2

(12) United States Patent
Heller et al.

(10) Patent No.: US 9,054,338 B2
(45) Date of Patent: Jun. 9, 2015

(54) OLED DEVICES COMPRISING HOLLOW OBJECTS

(75) Inventors: Christian Maria Anton Heller, Munich (DE); Matthew David Butts, Rexford, NY (US); Joseph John Shiang, Niskayuna, NY (US); Jie Jerry Liu, Niskayuna, NY (US); Kevin Henry Janora, Schenectady, NY (US)

(73) Assignee: General Electric Company, Niskayuna, NY (US)

( * ) Notice: Subject to any disclaimer, the term of this patent is extended or adjusted under 35 U.S.C. 154(b) by 22 days.

(21) Appl. No.: 13/250,683

(22) Filed: Sep. 30, 2011

(65) Prior Publication Data

US 2013/0082244 A1   Apr. 4, 2013

(51) Int. Cl.
| H01L 31/18 | (2006.01) |
| H01L 51/52 | (2006.01) |
| H01L 51/56 | (2006.01) |
| H01L 21/02 | (2006.01) |
| H01L 21/265 | (2006.01) |
| H01L 21/30 | (2006.01) |
| H01L 21/00 | (2006.01) |
| H01L 29/08 | (2006.01) |
| H01L 35/24 | (2006.01) |

(52) U.S. Cl.
CPC ..... *H01L 51/5268* (2013.01); *H01L 2251/5369* (2013.01)

(58) Field of Classification Search
CPC ............ H01L 51/0067; H01L 21/2236; H01L 31/1804; H01L 51/0039; H01L 31/02363
USPC ........ 257/40, 88, 98, E33.06; 438/23, 28, 82, 438/99, 287
See application file for complete search history.

(56) References Cited

U.S. PATENT DOCUMENTS

| 7,132,787 B2 * | 11/2006 | Ozkan et al. .................. 313/503 |
| 2006/0250084 A1 * | 11/2006 | Cok et al. ...................... 313/512 |
| 2006/0278880 A1 * | 12/2006 | Lee et al. ......................... 257/79 |
| 2007/0036705 A1 | 2/2007 | Butts et al. |
| 2007/0036736 A1 | 2/2007 | Kalla et al. |
| 2007/0152573 A1 * | 7/2007 | Kim et al. ..................... 313/506 |
| 2008/0018232 A1 * | 1/2008 | Zhang et al. .................. 313/498 |
| 2008/0138624 A1 * | 6/2008 | Lewis et al. ................... 428/412 |

(Continued)

FOREIGN PATENT DOCUMENTS

JP          2011-014534       *   1/2011    ............. H01L 51/50

OTHER PUBLICATIONS

Yamada, Masako, et al.; "Spatial and angular distribution of light incident on coatings using Mie-scattering Monte Carlo simulations"; J. Cosmet. Sci., 56. 193-204 (May/Jun. 2005).

*Primary Examiner* — Vongsavanh Sengdara
*Assistant Examiner* — Thai T Vuong
(74) *Attorney, Agent, or Firm* — Mary Louise Stanford

(57) ABSTRACT

Embodiments of the present disclosure include organic light emitting diode (OLED) devices having hollow objects configured to scatter otherwise trapped light out of the device, thereby improving the performance of the device. The hollow objects are dispersed in one or more organic layers of the OLED device. The hollow objects may have a similar refractive index to that of air, such that visible light emitted by the emissive layer may contact the hollow objects in the OLED device and may be scattered out of the device. In some embodiments, the hollow objects may be spherical or tubular, and may be sized to be larger than the visible light wavelength spectrum.

10 Claims, 3 Drawing Sheets

(56) References Cited

U.S. PATENT DOCUMENTS

| | | | |
|---|---|---|---|
| 2009/0026924 A1* | 1/2009 | Leung et al. | 313/504 |
| 2009/0114938 A1* | 5/2009 | Hsu et al. | 257/98 |
| 2009/0311512 A1* | 12/2009 | Braun et al. | 428/323 |
| 2010/0068504 A1* | 3/2010 | Lin et al. | 428/327 |
| 2010/0101649 A1* | 4/2010 | Huignard et al. | 136/261 |
| 2011/0140075 A1* | 6/2011 | Zhou et al. | 257/13 |
| 2011/0233168 A1* | 9/2011 | Krummacher | 216/24 |
| 2011/0248287 A1* | 10/2011 | Yuan et al. | 257/88 |
| 2011/0249446 A1* | 10/2011 | Epstein et al. | 362/296.09 |
| 2011/0286222 A1* | 11/2011 | Coleman | 362/326 |
| 2012/0068171 A1* | 3/2012 | Yamana et al. | 257/40 |
| 2012/0126689 A1* | 5/2012 | Gaerditz et al. | 313/504 |
| 2013/0001611 A1* | 1/2013 | Wang | 257/98 |

* cited by examiner

OLED DEVICES COMPRISING HOLLOW OBJECTS

BACKGROUND

Optoelectronic devices such as organic light emitting diodes (OLEDs) are being increasingly employed for lighting and display applications. The OLED includes a stack of thin organic layers disposed between two charged electrodes (anode and cathode). The organic layers may include a hole injection layer, a hole transport layer, an emissive layer, an electron transport layer, and an electron injection layer. Upon application of an appropriate voltage to the OLED lighting device, the injected positive and negative charges recombine in the emissive layer to produce light.

Typically, the light emitted by the emissive layer may transmit away from the emissive layer and out of the OLED to be viewed by a user and/or used by the optoelectronic device for various lighting or display applications. However, not all of the light emitted by the emissive layer may transmit out of the OLED. For example, some light (e.g., 20% in conventional OLEDs) may be trapped in various layers of the OLED, thereby decreasing the efficiency of the device, as not all of the light emitted by the emissive layer is utilized. Such inefficiencies may translate into higher operating power requirements and/or shorter lifespan of the device as the application of higher voltages may be necessary to obtain a desired luminescence of the OLED.

Some attempts at increasing the efficiency of the OLED include manipulating the layers of the OLED to increase the light emitted out of the device. For example, some techniques involve optimizing the thickness and possibly the refractive indexes of the OLED layers (commonly referred to as optimizing the OLED cavity), or incorporating scattering particles in the OLED layers to increase the scattering of otherwise trapped light out of the OLED.

BRIEF DESCRIPTION

In one embodiment, an organic light emitting diode (OLED) device is provided. The OLED device includes a bottom electrode, a plurality of organic layers disposed over the bottom electrode, and a top electrode disposed over the plurality of organic layers. One or more of the plurality of organic layers comprises dispersed hollow objects configured to scatter light.

In another embodiment, a method of forming an organic light emitting diode (OLED) device is provided. The method includes dispersing hollow objects over a plane of the OLED device and depositing a layer of the OLED device over the dispersed hollow objects.

Yet another embodiment involves an organic light emitting diode (OLED) stack. The OLED stack includes a transparent substrate, a conductive transparent material disposed over the transparent substrate, first non-emissive organic materials disposed over the conductive transparent material, electroluminescent materials disposed over the first non-emissive organic materials, second non-emissive organic materials disposed over the electroluminescent materials, hollow objects dispersed in the first non-emissive organic materials, the second non-emissive organic materials, or both, and a conductive reflective material disposed over the second non-emissive organic materials.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Organic materials are becoming increasingly utilized in circuit and lighting area technology due to the low cost and high performance offered by organic electronic devices and optoelectronic devices. However, typical OLED devices may not be operating at a desired level of efficiency, as a significant amount of light generated in the electroluminescent materials of the device may be trapped in the device. One or more embodiments of the present disclosure increases the amount of light that is transmitted out of an OLED device through the use of hollow objects configured to scatter otherwise trapped light out of the device. As will be discussed, the refractive index of gas-filled hollow objects may be sufficiently different from the refractive index of typical layers in the OLED device which may improve the scattering of otherwise trapped light out of the device layers, thereby improving the efficiency of the OLED device.

Figure 1:
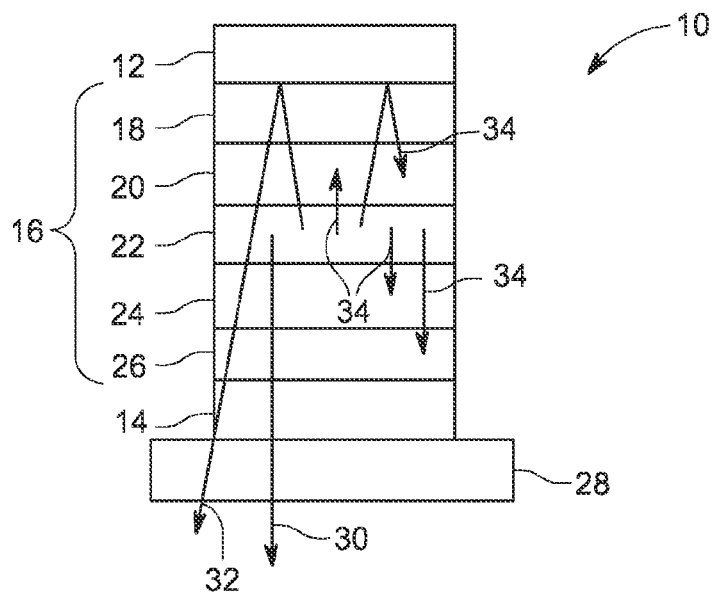
FIG. 1 depicts a side view of an organic light emitting diode (OLED) stack, in accordance with one embodiment of the present disclosure.

Referring to FIG. 1, the side view of an OLED stack 10 in an optoelectronic device is illustrated. The OLED stack 10 may include a top electrode (i.e., cathode) 12 and a bottom electrode (i.e., anode) 14 disposed over a substrate 28, with organic layers 16 disposed between the cathode 12 and the anode 14. In some embodiments, the organic layers 16 may include a hole injection layer 26 which may be disposed over the anode 14. A hole transport layer 24 may be disposed over the hole injection layer 26, and an emissive layer 22 may be disposed over the hole transport layer 24. An electron transport layer 20 may be disposed over the emissive layer 22, and an electron injection layer 18 may be disposed over the electron transport layer 20.

In some embodiments, the anode 14 may include a substantially transparent doped thin metal oxide film, such as indium tin oxide (ITO), tin oxide, indium oxide, zinc oxide, indium zinc oxide, zinc indium tin oxide, antimony oxide, and mixtures thereof. In different embodiments, the thickness of the anode 14 may range from approximately 10 nm to 200 nm, though other thicknesses are also contemplated.

Examples of materials suitable for the hole injection layer 26 disposed over the anode 14 may include proton-doped (i.e., "p-doped") conducting polymers, such as p-doped polythiophene or polyaniline, and p-doped organic semiconductors, such as tetrafluorotetracyanoquinodimethane (F4-

TCQN), doped organic and polymeric semiconductors, and triarylamine-containing compounds and polymers.

The hole transport layer 24 disposed over the hole injection layer 26 may include, for example, triaryldiamines, tetraphenyldiamines, aromatic tertiary amines, hydrazone derivatives, carbazole derivatives, triazole derivatives, imidazole derivatives, oxadiazole derivatives including an amino group, polythiophenes, and like materials. Non-limiting examples of materials suitable for a hole-blocking layer may include poly N-vinyl carbazole, and like materials.

The emissive layer 22 may include any electroluminescent organic materials that emit radiation in the visible spectrum upon electrical stimulation. In some embodiments, such materials may include electroluminescent organic materials which emit light in a determined wavelength range. For example, the electroluminescent organic materials in the emissive layer 22 may include small molecules, oligomers, polymers, copolymers, or a mixture thereof. For example, suitable electroluminescent organic materials 28 may include Tris(8-hydroxyquinolinato)aluminium (Alq3) and its derivatives; poly N-vinylcarbazole (PVK) and its derivatives; polyfluorene and its derivatives, such as polyalkylfluorene, for example poly-9,9-dihexylfluorene, polydioctylfluorene, or poly-9,9-bis-3,6-dioxaheptyl-fluorene-2,7-diyl; polyparaphenylene and its derivatives, such as poly-2-decyloxy-1,4-phenylene or poly-2,5-diheptyl-1,4-phenylene; polyp-phenylene vinylene and its derivatives, such as dialkoxy-substituted PPV and cyano-substituted PPV; polythiophene and its derivatives, such as poly-3-alkylthiophene, poly-4,4'-dialkyl-2,2'-bithiophene, poly-2,5-thienylene vinylene; polypyridine vinylene and its derivatives; polyquinoxaline and its derivatives; and polyquinoline and its derivatives. In one embodiment, a suitable electroluminescent material is poly-9,9-dioctylfluorenyl-2,7-diyl end capped with N,N-bis4-methylphenyl-4-aniline. Mixtures of these polymers or copolymers based on one or more of these polymers may be used. Other suitable materials may include polysilanes, or linear polymers having a silicon-backbone substituted with an alkyl and/or aryl side groups. Polysilanes are quasi one-dimensional materials with delocalized sigma-conjugated electrons along polymer backbone chains. Examples of polysilanes include poly di-n-butylsilane, poly di-n-pentylsilane, poly di-n-hexylsilane, polymethyl phenylsilane, and poly bis p-butyl phenylsilane.

The electron transport layer 20 disposed over the emissive layer 22 may include small molecules or low-to-intermediate molecular weight organic polymers, for example, organic polymers having weight average molecular weights of less than about 200,000 grams per mole as determined using polystyrene standards. Such polymers may include, for example, poly-3,4-ethylene dioxy thiophene (PDOT), polyaniline, poly-3,4-propylene dioxythiophene (PProDOT), polystyrene sulfonate (PSS), polyvinyl carbazole (PVK), and other like materials. The electron injection layer 18 disposed over the electron transport layer 20 may include, for example, sodium fluoride or potassium fluoride, or other like materials.

The cathode 12 may include conductive, reflective materials such as aluminum, silver, indium, tin, zinc, other suitable metals, and combinations thereof. In some embodiments, the cathode 12 may also be relatively thin (e.g., 30 nm) and may be transparent. The cathode 12 may be deposited over the electron injection layer 18 by, for example, physical vapor deposition, chemical vapor deposition, sputtering or liquid coating.

In some embodiments, the OLED stack 10 may also include different or additional non-emissive materials which may improve the performance or lifespan of the electroluminescent materials in the emissive layer 22. For example, in addition to the hole injection layer 26, the hole transport layer 24, the electron transport layer 20 and the electron injection layer 18, the stack 10 may also include layers such as a hole injection enhancement layer, an electron injection enhancement layer or any combinations thereof. Furthermore, in some embodiments, the layers of the OLED stack 10 may be arranged in different orders or in different combinations, and additional layers may be disposed between the layers illustrated in FIG. 1.

During operation of an optoelectronic device, a voltage may be applied across the OLED stack 10. The voltage may charge the anode 14 to a positive charge and the cathode 12 to a negative charge, and electrons may flow through the stack 10 from the negatively charged cathode 12 to the positively charged anode 14. More specifically, electrons may be withdrawn from the organic materials adjacent to the anode 14 and injected to the organic materials adjacent to the cathode 12. The process of withdrawing electrons from the anode-side organic materials may also be referred to as hole injection and hole transport, and the process of injecting the electrons to the cathode-side organic materials may also be referred to as electron transport and electron injection. During the process of hole and electron transport/injection, electrons are withdrawn from the hole injection layer 26, transported through the hole transport layer 24 and the electron transport layer 20, and injected to the electron injection layer 18. Electrostatic forces may combine the electrons and holes in the emissive layer 22 to form an excited bound state (i.e., an exciton) which upon de-excitation, emits radiation having frequencies in the visible region of the electromagnetic spectrum (e.g., visible light). The frequency of the emitted radiation and the colors and/or characteristics of visible light may vary in different embodiments depending on the properties of the particular materials used in the OLED stack 10.

The visible light emitted at the emissive layer 22 may be transmitted (as indicated by the arrow 30) through the organic layers 24 and 26 and through the transparent anode 14 and substrate 28. In some embodiments, the light which travels from the emissive layer 22 through the organic layers 20 and 18 may be reflected (as indicated by the arrow 32) by a reflective cathode 12 and transmitted out through the substrate 28. The visible light may then be used to illuminate a display or lighting application of the optoelectronic device.

However, the light emitted by the emissive layer may not all pass through the substrate 28 to illuminate the device. As represented by the arrows 34, emitted light may sometimes become "trapped" in, or may not pass through the organic layers 18, 20, 24, and/or 26. For example, in some conventional devices, about 20% of light emitted by emissive materials may be trapped in the layers of the device. The trapped light decreases the efficiency of the device, as not all of the generated radiation is emitted through the substrate 28 to be utilized by the device or perceived by a user. Therefore, not all of the voltage applied through the stack 10 results in useful radiation.

In embodiments of the present disclosure, hollow objects may be dispersed in one or more layers of an OLED stack 10 to increase the scattering of light. The air- or gas-filled hollow objects used in some embodiments have cores characterized by a refractive index of approximately 1, which is sufficiently different from the refractive index of typical OLED layers (~1.4 to 2.0), thereby affecting the path of light through the layers of the OLED stack 10. Because otherwise trapped light has a relatively longer path length within the OLED stack 10 relative to light which is emitted perpendicularly out of the stack 10, the otherwise trapped light may be scattered by such hollow objects. Such scattering may improve light extraction out of the OLED stack 10. In some embodiments, the hollow objects may be surface treated to increase particle dispersion and compatibility with the matrix. This surface treatment may be hydrophilic or hydrophobic.

Figure 2:
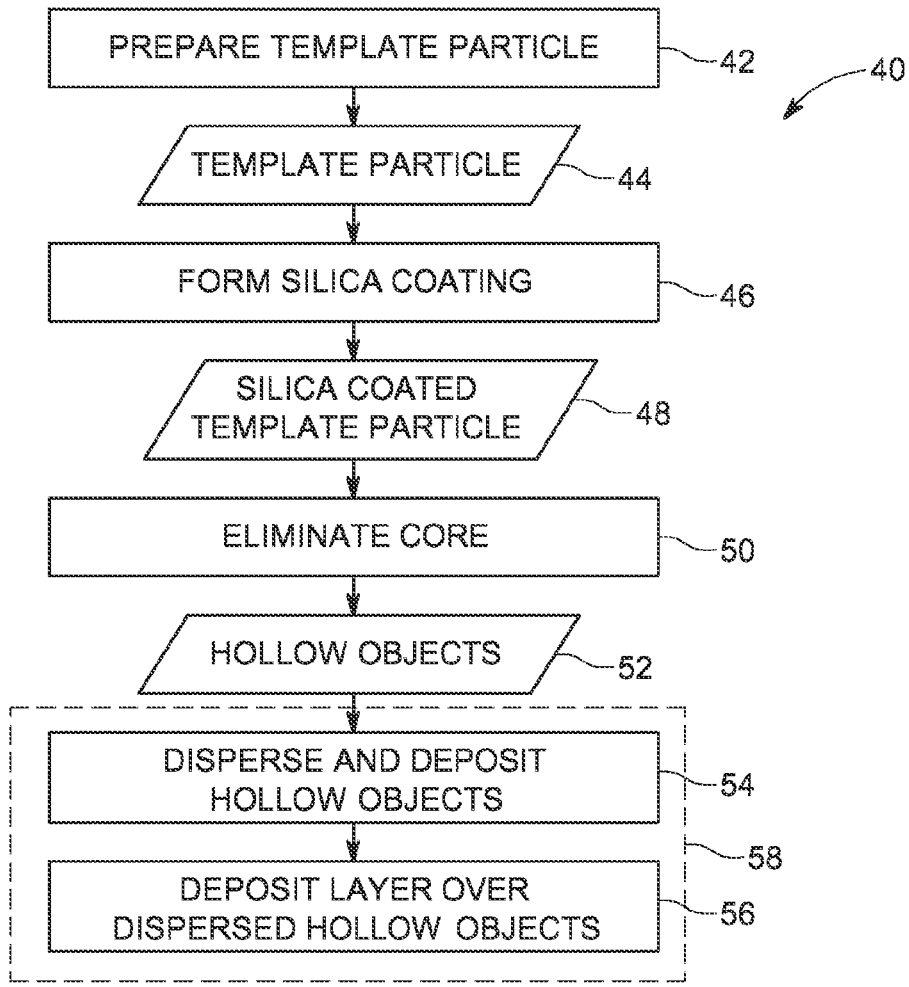
FIG. 2 is a flow chart of a method of forming hollow objects and implementing the hollow objects in the OLED stack of FIG. 1, in accordance with one embodiment of the present disclosure.
Figure 3:
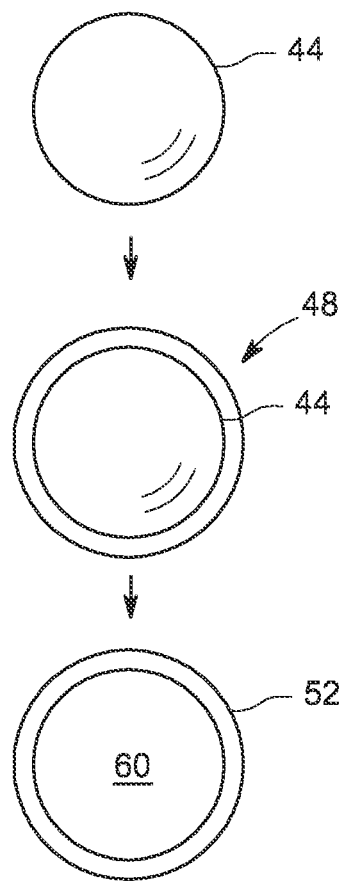
FIG. 3 is a schematic diagram representing the formation of hollow objects, in accordance with one embodiment of the present disclosure.

FIG. 2 is a flow chart of a process 40 for making hollow objects and implementing the particles in an OLED stack 10, and FIG. 3 is a schematic diagram representing intermediate stages of the hollow objects formed in the process 40 of FIG. 2. As such, FIGS. 2 and 3 may be discussed concurrently. The process 40 may begin with preparing (block 42) a template particle 44. For a discussion of various techniques involved in forming the hollow objects, see U.S. Application No. 2007/0036705, incorporated herein by reference in its entirety.

In some embodiments, a process 40 for making hollow objects involves preparing a template particle 44 by polymerizing styrene under certain conditions. Such conditions may include heat treatment and/or addition of reactants in certain concentrations under an appropriate temperature and other processing conditions. For example, an emulsion, dispersion, or suspension polymerization reaction may be carried out at around 70° C. The template particles 44 formed may have a particle size between approximately 40 nm to 700 nm in diameter.

Once the template particles 44 are formed, the process 40 involves forming (block 46) a silica coating over the template particle 44 by treating the template particles 44 with a coupling agent followed by silicon-containing compounds or mixture of compounds under certain pH and temperature conditions, resulting in silica coated template particles 48. While silica is one example of a suitable material for forming the hollow objects 54, it should be noted that suitable materials may include any material which does not increase non-radiative decay, create electrical shorts within the OLED stack 10, or decrease the operational life of organic elements used in the OLED stack 10. For example, in some embodiments, other suitable materials for making the hollow objects 52 may include co- and terpolymer systems made from vinylidene chloride and acrylonitrile, or from vinylidene chloride, acrylonitrile, and methylmethacrylate, styrene, acrylate, or combinations thereof. In some embodiments, a suitable surfactant (e.g., alkyl sulfates, alkyl sulfonates, linear alkyl arylsulfonates, or combinations thereof) may be used, and the pH and temperature may adjusted to approximately 9 to 11 and approximately 45° C. to 90° C., respectively.

The silica coated template particles 48 may have a substantially uniform silica-containing coating. The process 40 then involves eliminating (block 50) the core by isolating and heating the silica coated template particle 48 at sufficiently high temperatures to remove the core (e.g., the template particle 44), leaving a hollow object 52. The hollow objects 52 may be substantially filled with gases 60 (e.g., air or a combination of atmospheric gases). In some embodiments, the silica coated template particles 48 may be isolated by centrifugation or filtration and heated to a temperature at which template depolymerization and volatilization occurs, such as at approximately 325° C. to 525° C. In some embodiments, the thickness of the hollow objects 52 may be sufficiently stable against mechanical stresses which may be applied against the objects 52 during the manufacture, formulation, and use of the OLED stack 10 or OLED device. In some embodiments, the thickness of the wall of the hollow objects 52 may be approximately 10 nm to 100 nm. Further, in some embodiments, the thickness of the wall of the hollow objects may be approximately 10 nm to 50 nm.

Once the hollow objects 52 are formed, the process 40 may involve forming (block 58) an OLED stack layer having dispersed hollow objects 52. In one embodiment, forming (block 58) the OLED stack layer may involve dispersing and depositing (block 54) the hollow objects 52 over one or more layers of the OLED stack 10 and depositing (block 56) an OLED stack layer over the deposited hollow objects. For example, to implement hollow objects 52 in an electron transport layer 20, the hollow objects 52 may be dispersed over the emissive layer 22, and the electron transport layer 20 may be deposited over the hollow objects 52. Similarly, to implement the hollow objects 52 in the hole injection layer 26, the hollow objects 52 may be deposited over the anode 14, and the hole injection layer 26 may be deposited over the hollow objects 52. In some embodiments, a suitable medium may be employed to aid in the dispersion and deposition of the hollow objects 52 in the deposited OLED stack layer.

In some embodiments, forming (block 58) an OLED stack layer with dispersed hollow objects 52 may include dispersing the hollow objects 52 in a formulation having one or more layer components or precursors to layer components and then depositing the formulations having the dispersed hollow particles 52 onto one or more layers of the OLED stack 10. In some embodiments, the layers with dispersed hollow objects 52 may be processed to be appropriately shaped or sized in the OLED stack 10. For example, spin casting, rollers, or blades may be used to form layers with dispersed hollow objects 52.

In some embodiments, approximately 10% or less of a plane through an OLED stack layer may include hollow objects 52. Furthermore, in some embodiments, the hollow objects 52 may be denser in one or more layers of the OLED stack 10. For example, the hollow objects 52 may cover approximately 10%-30% of a plane of one or more OLED stack layers.

Because some layers of the OLED stack 10 may have different properties and different behaviors with respect to the hollow objects 52, certain layers may be further treated to properly implement the hollow objects 52 in the OLED stack 10. In one embodiment, the air-filled hollow objects 52 may present a substantially hydrophilic outer surface. Therefore, when implementing such hollow objects 52 into layers of the OLED stack 10 which are substantially hydrophobic (e.g., the hole transport layer 24 or the electron transport layer 20), the hollow objects 52 may be treated for improved suspension in the layers. For example, in some embodiments, the hollow objects 52 may be hydrophobized using a suitable hexamethyldisilazane (HMDZ) treatment.

In some embodiments, the hollow objects are substantially hollow and non-conductive and may have a refractive index of approximately 1, or that which is characteristic of gases. The hollow objects may be spherical in shape (i.e., hollow spheres) or, in some embodiments, the hollow objects may be tubular in shape. In certain implementations, spherical hollow objects may have a diameter of approximately 50 nm to 750 nm, and in some embodiments, tubular hollow objects may have a diameter of approximately 50 nm and may be 750 nm or greater in length. In some embodiments, the hollow objects 52 may be small enough to not be perceivable by a viewer of the OLED stack 10, as particles which are too large may appear as dark spots under high optical magnification in the stack 10. The hollow objects 52 may also be large enough to scatter visible light.

The determination of the optimal size and shape of the scattering hollow objects 52 in the OLED stack 10 depends on the thicknesses of the organic layers in the OLED stack 10, the choice of electrode materials, the fractional coverage of the hollow objects 52 in the layers in which they are dispersed, and the refractive index contrast of the hollow objects 52 with the layers of the OLED stack 10. The relative importance of these different parameters can be estimated using a combination of both Mie scattering theory (H. C. Van De Hulst, Light Scattering by Small Particles, (Dover, N.Y., 1981)) and radiative transport theory (J. J. Shiang, A. R. Duggal, Journal of Applied Physics, vol. 95, pg 2880, (2004)) or calculated for certain model cases using finite-difference time-domain (FDTD) methods.

For example, in one experiment, light having a wavelength of 550 nm were directed at non-absorbing spheres having a refractive index near 1 embedded in a dielectric medium with an optical index of 1.7. The Mie scattering properties were calculated, including the scattering cross-section and the expectation value of the cosine of the angular deviation of the light, which is a measure of the degree to which the light is forward or backward scattered. Particle sizes in the range of 10 nm-1000 nm were examined. Based on the results, for particles sized between approximately 400 nm-500 nm, the scattering cross-section increased at a rate faster than the geometric cross-section. Additionally, the degree of forward scattering increased. For particles sized above approximately 500 nm, the scattering cross-section increased in a manner approximately proportional to the geometric cross-section. Furthermore, the anisotropy, as defined by the expectation value of the cosine of the deviation angle, remained around 0.8. The cross-section and anisotropy results were used in a radiative transport model that calculated the fraction of light emerging from a 200 nm thick slab of optical index 1.7 into air, assuming a Lambertian emitter input at the side opposite to the air. The side opposite to the air was assumed to be a mirror with a reflectivity of 0.73 and the particle loading assumed to be 5% volume fraction, evenly dispersed throughout the layer. At such loading fractions, the fraction of light that is scattered by a light beam making a single traverse through the slab is relatively small. Small loading fractions may reduce the degree to which the electrically inert spheres interfere with the electrical properties of the OLED. In such low scattering conditions, the total amount light extracted increases until about 200 nm diameter particles (i.e. comparable to the thickness of the layer). For slab thickness 1000 nm thick, the particles may be approximately 200 nm in diameter, and the calculated light output may increase from 0.33 (10 nm spheres) to 0.36 (50 nm spheres) up to 0.50 (200 nm spheres). Accordingly, in various embodiments, particle size of the hollow objects 52 ranges from about 0.01 microns in diameter to about 10 microns in diameter, particularly from about 0.01 microns in diameter to about 1 micron in diameter, more particularly from about 0.05 microns in diameter to about 0.2 microns in diameter. The hollow objects 52 may be spherical (i.e., hollow spheres) or tubular in shape. Tubular hollow objects 52 may have a diameter of approximately 50 nm and may be 750 nm or greater in length.

Figure 4:
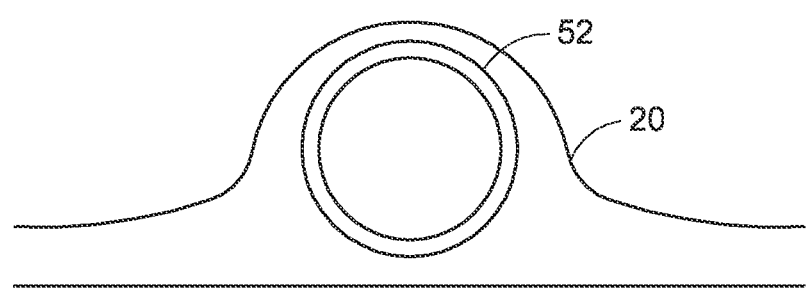
FIG. 4 is a side view of an organic layer of an OLED stack having a hollow object, in accordance with one embodiment of the present disclosure.
Figure 5:
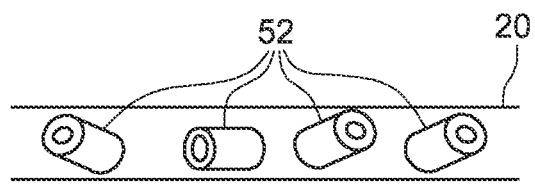
FIG. 5 is a side view of an organic layer of an OLED stack having relatively smaller hollow objects, in accordance with one embodiment of the present disclosure.

The organic layers of the OLED stack 10 may be approximately 100 nm thick, though in some embodiments, the thickness of the layers in the OLED stack 10 may vary depending on the configuration of the device and/or the desired wavelength of light to be emitted. In embodiments where the hollow objects 52 are larger in diameter than the thickness of the layer 20 in which it is dispersed, the layer 20 may form a dome over the hollow object 52, such as the spherical hollow object illustrated in FIG. 4. Layers which are deposited over the dome formed over the hollow object 52 may likewise be domed, which may significantly enhance light scattering, especially for a reflective (metallic) top electrode layer. In embodiments where the hollow objects 52 are smaller in diameter than the thickness of the layer 20 in which they are dispersed, such as the tubular hollow objects 52 illustrated in FIG. 5, the hollow objects 52 may be suspended in the layer 20. While the hollow objects 52 are illustrated in FIGS. 4 and 5 as being dispersed in the electron transport layer 20, in accordance with the present embodiments, the hollow objects 52 may be implemented in any layer or multiple layers of the OLED stack 10.

Figure 6:
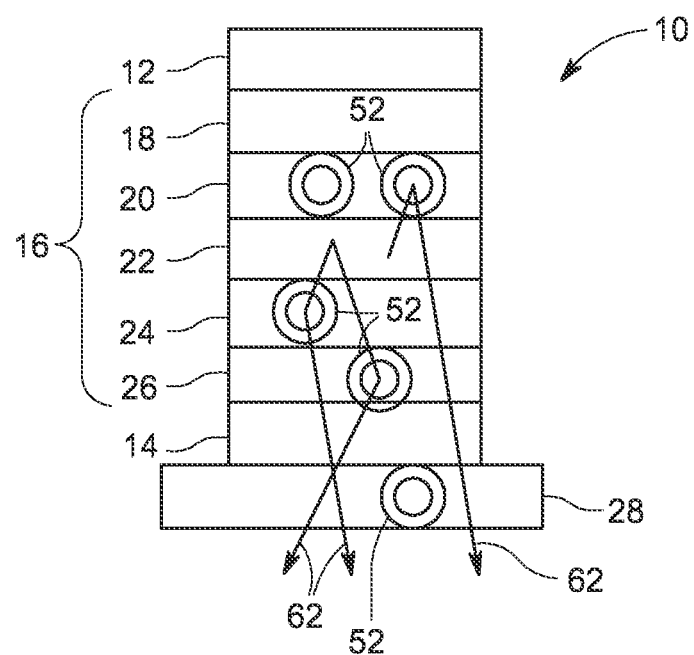
FIG. 6 depicts a side view of an OLED stack having hollow objects, in accordance with one embodiment of the present disclosure.

FIG. 6 is a side view illustration representing an OLED stack 10 having hollow objects 52 dispersed in multiple different layers of the stack 10. For example, the hollow objects 52 may be dispersed in the electron transport layer 20, the hole transport layer 24, the hole injection layer 26, and/or the substrate 28. The hollow objects 52 may scatter light emitted by the emissive layer 22, as represented by the arrows 62, thereby improving the percentage of light emitted by the emissive layer 20 which transmits out of the substrate 28. In some embodiments, the luminescence of an OLED stack 10 implementing hollow objects for light scattering may improve by approximately 20% in comparison to the luminescence of a comparable stack without hollow objects, using the same activating voltage.

It should be noted that as previously discussed, the OLED stack 10 may include various additional layers, and the hollow objects 52 may be dispersed in one or more of the illustrated layers or other additional layers of an OLED device. For instance, in some embodiments, the OLED stack 10 may include a functional layer, such as an encapsulation layer, disposed over the cathode 12. Furthermore, the OLED stack 10 may include a planarizing layer or smoothing layer disposed over the substrate 28, beneath the anode 14. In some embodiments, the hollow objects 52 may be dispersed in the functional layer or smoothing layer, and/or other layers of the OLED stack 10 to increase light scattering out of the OLED stack 10.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. An organic light emitting diode (OLED) device, comprising:
   a bottom electrode;
   a plurality of organic layers comprising an electron injection layer, an electron transport layer, an emissive layer, a hole transport layer, a hole injection layer, or combinations thereof and disposed over the bottom electrode, wherein one or more of the electron transport layers comprises dispersed hollow objects, wherein the hollow objects have a refractive index of approximately 1; and
   a top electrode disposed over the plurality of organic layers.

2. The OLED device of claim 1, comprising a substrate comprising glass, plastic, other suitable transparent materials, or combinations thereof.

3. The OLED device of claim 2, wherein the substrate comprises dispersed hollow objects that scatter light out of the OLED device when the OLED device emits light.

4. The OLED device of claim 2, comprising a smoothing layer disposed over the substrate, wherein the smoothing layer comprises dispersed hollow objects.

5. The OLED device of claim 1, comprising hollow objects disposed over the top electrode.

6. The OLED device of claim 1, comprising a functional layer disposed over the top electrode, wherein the functional layer comprises dispersed hollow objects.

7. The OLED device of claim 1, wherein the hollow objects comprise a plurality of hollow spherical objects, hollow tubular objects, fiber shaped objects, or combinations thereof.

8. The OLED device of claim 1, wherein the hollow objects comprise a silica-containing material disposed about a substantially hollow core.

9. The OLED device of claim 1, wherein the hollow objects are approximately 0.01 microns in diameter to about 10 microns in diameter.

10. The OLED device of claim 1, wherein the hollow objects are smaller in diameter than a thickness of one of the plurality of organic layers in which the hollow objects are dispersed.

\* \* \* \* \*